(12) United States Patent
Kaule (10) Patent No.: US 7,655,381 B2
(45) Date of Patent: Feb. 2, 2010

(54) METHOD FOR PRODUCING RESIST SUBSTRATES

(75) Inventor: Wittich Kaule, Emmering (DE)

(73) Assignee: Giesecke & Devrient GmbH, Munich (DE)

( * ) Notice: Subject to any disclaimer, the term of this patent is extended or adjusted under 35 U.S.C. 154(b) by 585 days.

(21) Appl. No.: 10/545,261

(22) PCT Filed: Feb. 24, 2004

(86) PCT No.: PCT/EP2004/001817

§ 371 (c)(1),
(2), (4) Date: May 1, 2006

(87) PCT Pub. No.: WO2004/077161

PCT Pub. Date: Sep. 10, 2004

(65) Prior Publication Data

US 2006/0257583 A1     Nov. 16, 2006

(30) Foreign Application Priority Data

Feb. 26, 2003   (DE) ................. 103 08 317

(51) Int. Cl.
*G03C 5/00* (2006.01)
(52) U.S. Cl. .............. 430/296; 430/510; 430/511; 430/512; 430/942
(58) Field of Classification Search ............... 430/296, 430/510, 511, 512, 942
See application file for complete search history.

(56) References Cited

U.S. PATENT DOCUMENTS

| | | | |
|---|---|---|---|
| 3,961,102 A | 6/1976 | Ballantyne et al. | |
| 6,344,275 B2 | 2/2002 | Katsumura et al. | |
| 6,569,578 B2 | 5/2003 | Nozaki et al. | |

FOREIGN PATENT DOCUMENTS

| | | |
|---|---|---|
| CN | 1341928 A | 3/2002 |
| EP | 1156138 A2 | 11/2001 |

OTHER PUBLICATIONS

M. Gentili et al: "Fabrication of controlled slope attenuated phase-shift X-ray masks for 250 nm synchrotron lithography" Journal of Vacuum Science and Technology: Part B, American Institute of Physics, New York, US, vol. 12, No. 6, Nov. 1, 1994, pp. 3954-3958, XP000497202, ISSN: 1071-1023.

H. Itoh et al: "Charging effects on trilevel resist and metal layer in electron-beam lithograph", Journal of Vacuum Science & Technology B, Microelectronics Processing and Phenomena, USA, vol. 9, No. 6, 1991, pp. 3039-3042, XP002303455, ISSN: 0734-211X.

Ernst-Bernhard Kley: "Continuous profile writing by electron and optical lithography", Microelectronic Engineering, Elsevier Publishers BV., Amsterdam, NL, vol. 34, Dec. 1, 1997, pp. 261-298, XP004108294, ISSN: 0167-9317.

"Electron Beam/Optical Stepper Mixed Lithography" (Liu Ming, Chen Baoqin, Liu Xiao-wei, Wei Lin-peng, Wu De-xin; No. 1, Microfabrication Technology, 2002-2-3-31), pp. 13-17.

"Digital pixel hologram by means of e-beam lithography" (Wang tianji, Li Yaotang, Yang Shining, Zhang Shichao, Fan Shaowu, Wen Huanrong, W.H. Hong, N. K. Bao, E. Y. B. Pun, P.S. Chung, Laser Journal (vol. 20, No. 3, 1999), pp. 34, 35 and 57.

*Primary Examiner*—Christopher G Young
(74) *Attorney, Agent, or Firm*—Bacon & Thomas, PLLC (57) ABSTRACT

The invention relates to a method for producing a substrate having a resist layer in the form of a relief structure, which represents a diffraction structure. The resist layer at least in certain areas adjoins a conductive layer, which scatters the primary electrons and/or produces secondary electrons when the resist layer is exposed by means of an electron beam. With this method the material of the resist layer and the conductive layer and the exposure parameters are adjusted to each other such that the resist layer is also exposed outside the area impinged with the electron beam such that the flanks of the relief structure obtain an inclined form.

14 Claims, 9 Drawing Sheets

METHOD FOR PRODUCING RESIST SUBSTRATES

The invention relates to a method for producing a substrate having a resist layer in the form of a relief structure, which represents a diffraction structure, the substrate having a conductive layer, which scatters the primary electrons and/or produces secondary electrons when the resist layer is exposed by an electron beam.

Furthermore, the invention relates to a resist master and a resist substrate.

Optically variable elements, which have optical properties varying with the viewing angle, are often used for protecting documents of value such as credit cards, bank notes or the like from forgery or copying, but also for product protection on any product packaging. The optically variable elements have the diffraction structure of a true hologram, computer hologram or the diffraction structure of a grating image with grating fields disposed side-by-side. In general terms there can be stated that a hologram is an overlapping of diffraction gratings. A grating image, however, is composed of a plurality of grating fields disposed side-by-side that each have a uniform diffraction grating. The diffraction gratings of the different grating fields may differ from each other with regard to the grating constant or the azimuth angle or the contour or the outline of the image area covered with the respective diffraction grating. The grating constant corresponds to the distance between the grating lines and is of essential importance for the color of the respective image area in the grating image visible when viewed from a certain viewing angle. The azimuth angle describes the inclination of the grating lines in relation to a reference direction and is responsible for the visibility of the image areas when viewed from certain viewing directions. On the basis of this technique thus optically variable elements e.g. moving images or also plastically appearing images can be produced.

For the mass production of the optically variable elements usually so-called "master structures" are produced, which have the respective phase information about the optically variable element in the form of a spatial relief structure. This, typically, is a glass substrate, plastic substrate, metal substrate or semiconductor substrate having a photoresist coating in which the diffraction structure is preserved in the form of peaks and valleys. Starting out from this master structure, by duplicating and molding the relief structure there can be produced embossing tools of any desired form, with the help of which the diffraction structures represented by the relief structure can be transferred in large quantities to suitable substrates. The relief structures can either be produced by a holographic exposure or by means of electron beam lithography.

The electron beam lithography includes that a so called e-beam resist layer which is sensitive to an electron beam is inscribed with an electron beam.

The term "resist" in this context shall mean a radiosensitive lacquer, the term "photoresist" referring to sensitivity to light and the term "e-beam resist" referring to sensitivity to exposure by an electron beam. Furthermore, types of resists are known, which are sensitive to both electromagnetic radiation, in particular light, and to exposure by electrons.

From a chemical point of view a resist is a film-forming material, the solubility behavior of which changes under luminous radiation or particle radiation.

As "positive resist" resist materials are referred to that when exposed to radiation become easily soluble by degradation or conversion of active groups. During the subsequent treatment the radiation-exposed areas are dissolved, while the non-radiation-exposed areas are left.

As "negative resist" resist materials are referred to that when exposed to radiation become hardly soluble or insoluble by crosslinking or polymerization. As a consequence in this case the non-radiation-exposed areas are dissolved with the subsequent treatment, while the radiation-exposed areas are left.

While with the usual applications of electron beam lithography in microelectronics and micromechanics sharp limitations of the writing area of the electron beam are demanded and relief structure flanks extending at a right angle to the substrate surface are the goal, the relief structures representing the diffraction structure of an optically variable element in general shall have flatly sloping flanks or flanks with a defined steepness.

As to produce flatly sloping flanks of the relief structure different methods are known:

It is known to expose a plurality of tracks located side-by-side along a given flank with different radiation dosages. Depending on the intensity of the radiation dosage the resist material is exposed up to a predetermined depth, so that after the development a relief structure with flat flanks is the result.

It is further known to apply a plurality of photoresist layers having different sensitivities one above the other and to expose said layers in a plurality of passes with different masks. With this proceeding the result will be step-shaped flanks, which approximatively form a flatly extending flank of the relief structure.

These known methods are time-consuming and require special types of resists that are adjusted to the flank problem and with respect to their other properties are not optimal. Both the plurality of exposure processes for forming a flank and the work with different types of resists increase the processing time in a considerable manner. In particular it is required to work with relatively insensitive resist materials.

Starting out from this prior art it is the problem of the invention to provide a method, with which for electron beam lithography, in particular for producing hologram-like structures, in a resist layer a relief structure with flat flanks or flanks with defined steepness can be produced in a simple fashion. Furthermore, it is the problem of the invention to create a resist substrate suitable for the execution of the method and a resist master for embossing tools.

These problems are solved by the method and the resist substrate and the resist master with the features disclosed herein.

Since the resist layer in general is not conductive, for the electron beam exposure an additional conductive layer is required so as to be able to divert the electrons of the incident electron beam ("primary electrons"). This conductive layer can be the substrate on which the resist layer is located, or an additional conductive layer such as e.g. a metal layer or a conductive polymer layer. When the primary electrons impinge on the conductive layer, these electrons partially are scattered and/or produce so-called "secondary electrons", which are ejected from the conductive layer. The scattered primary electrons and the secondary electrons also spread out into the neighboring resist layer, so that the resist layer is also exposed outside the area that has been directly impinged with the electron beam ("proximity effect"). Since the exposure in this way is broadened or becomes indistinct, this effect is undesired and is suppressed as much as possible.

The invention is based on the finding that the range of action of this additional exposure depends on the electron beam energy and on the conductive material used, and that by a suitable selection of the exposure parameters and of the conductive material the proximity effect can be selectively used for the production of inclined flanks such as necessary for producing resist masters.

With the method according to the invention the material of the resist layer and the conductive layer and the exposure parameters are adjusted to each other such that the resist layer is also exposed outside the area impinged with the electron beam such that the flanks of the relief structure obtain an inclined form. The basic points for this are that flatter flanks can be produced by a higher atomic number of the metal contained in the conductive layer, by a softer gradation of the resist, by a higher accelerating voltage of the electrons, and by a more indistinct and larger beam width.

This method has the advantage that compared to conventional methods for producing a substrate with a resist layer in the form of a relief structure it can be carried out within a substantially shorter period of time, since only one single exposure step is required. In addition the exposure time is reduced, since by the secondary electrodes the effective radiation dosage altogether is increased. Furthermore, the method can be used for a wide range of types of resists. Therefore, this method does not depend on the use of insensitive resist materials as it is the case with the known methods. The inclination of the flanks of the relief structure also leads to a good separation behavior of the embossed lacquer from the embossing molds, which are molded from the relief structure.

For the conductive layer due to their good working properties preferably metal layers or metal alloy layers made of tungsten, gold, palladium, chromium, aluminum or mixes of these metals are used. A high rate of scattering and emission of secondary electrons is achieved for example with tungsten, gold or a gold-palladium alloy. Since the proximity effect is more intense the higher the atomic number of the chemical element used, the use of metals with high atomic numbers, in particular more than 50, is preferred.

The conductive layer can form the carrier substrate for the resist layer or can be applied as a separate layer. In some embodiments it may be necessary to remove the conductive layer after the electron beam exposure. For this purpose respective solvents are used. The electron beam exposure is effected with electron beam energy in the range of 0.1 to 100 keV, preferably in the range of 1 to 50 keV.

According to a first embodiment the conductive layer is disposed intermediate between the resist layer and the substrate. As a resist layer a negative resist is used, so that by the backscatter of the primary electrons and the emission of secondary electrons areas of the resist are exposed too that are located adjacent to the conductive layer and next to the directly exposed area. During the development of the negative resist the not exposed areas are removed arid only the areas directly exposed with the electron beam and additionally exposed by the proximity effect are left on the substrate.

According to a second embodiment a positive resist is used, on which the conductive layer is provided on a surface facing away from the substrate. Here by the forward scattering of the primary electrons and by the emission of secondary electrons the resist areas located adjacent to the conductive layer and outside the directly exposed area are exposed likewise. During the development the exposed areas are dissolved and only the unexposed areas, which neither are exposed directly nor by the proximity effect, are left on the substrate.

According to a further embodiment of the method the electron beam exposure can be combined with an optical exposure in the form of electromagnetic radiation.

With such an embodiment for example onto the substrate is applied a positive resist, which can be exposed both with electromagnetic radiation and with an electron beam. With this method at first an optical exposure is made. During the optical exposure the areas intended for the exposure with the electron beam are covered with an opaque mask. After the optical exposure the conductive layer is applied onto the not yet developed positive resist. The areas previously covered with an opaque mask then are exposed with the help of an electron beam, the forward scattering of the beam electrons and the emission of the secondary electrons out of the conductive layer effecting the exposure of the resist layer located below the conductive layer and of the area next to the area directly impinged with the electron beam. Then the conductive layer is removed with a suitable solvent and the positive resist is developed.

In a modified embodiment a negative resist is used. Here the negative resist is disposed before the conductive layer when viewed in ray direction. For avoiding reflection effects during the optical exposure, intermediate between the resist layer and the conductive layer a layer absorbing luminous radiation can be provided.

In further embodiments different resist layers can be disposed one behind the other when viewed in ray direction. For example it is possible to dispose a first resist layer exposable by electromagnetic radiation when viewed in ray direction before a second resist layer exposable by an electron beam. The conductive layer here can be disposed intermediate between the two resist layers or when viewed in ray direction behind the second resist layer exposable by an electron beam.

The different embodiments of the method serve for producing a substrate, which is provided with a resist layer having a relief-like structure. The substrate produced according to the inventive method, the so-called "resist master", after the development is galvanically molded and duplicated according to known methods, so as to produce an embossing die, in particular an embossing cylinder. With the help of the embossing dies security elements can be produced, which are used for protecting documents of value, such as for example bank notes, checks, ID cards or the like. In the area of product protection, too, embossed diffraction structure are often used.

In the following the invention is described by way of example with reference to the accompanying figures.

Figure 1A:
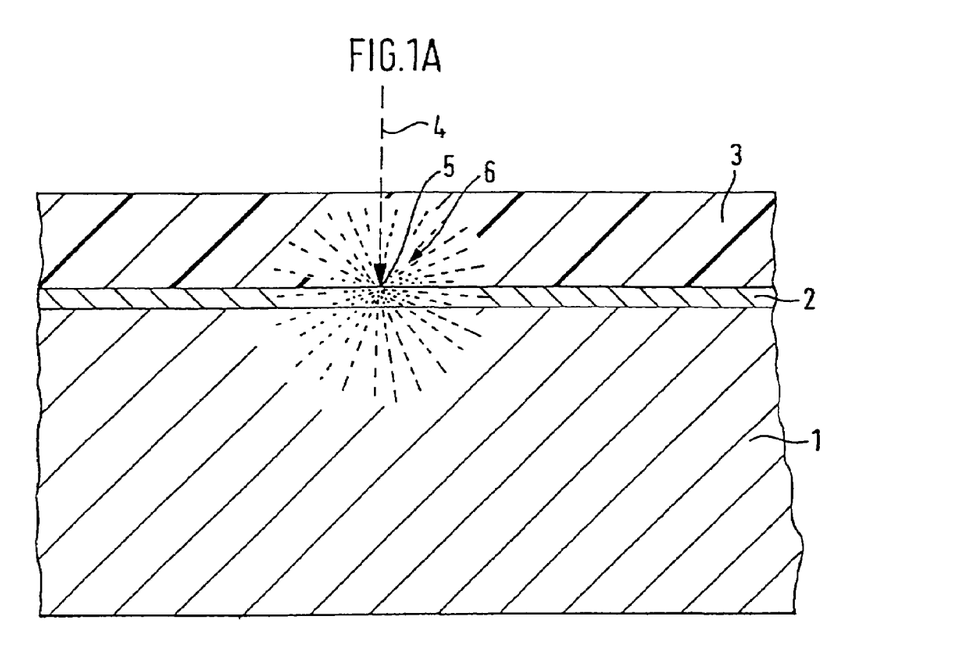
FIGS. 1A and B show the exposure of a substrate coated with a negative resist with an electron beam and a cross-sectional view of the substrate after the development.

FIG. 1A is a cross-sectional view of a substrate 1, onto which a conductive layer 2 made of a conductive material is applied. The conductive layer 2 for example can be produced of a metal or a metal alloy or a conductive polymer. Above the conductive layer 2 is located a resist layer 3 made of a negative resist. Since the negative resist 3 in general is not conductive, the conductive layer 2 serves for diverting the electrons incident with an electron beam 4. The conductive layer 2 can be abandoned, when the substrate 1 is sufficiently conductive.

Since the conductive layer 2 scatters the primary electrons incident with the electron beam 4 and since by the conductive layer 2 additionally secondary electrons are emitted, around a target area 5 impinged with the electron beam 4 an exposure area 6 is formed, by which an area of the negative resist 3 adjacent to the target area 5 is exposed. The extent of the exposure area 6 is determined by the materials used, the accelerating voltage of the electrons and by the radiation dosage which depends on the intensity and the writing speed of the electron beam 4.

This scattering of the primary electrons and the emission of secondary electrons are referred to as proximity effect. The proximity effect is stronger the higher the atomic number of the material used for the conductive layer 2. As to obtain a high rate for the scattering of the primary electrons and the emission of the secondary electrons, for the conductive layer 2 preferably metals with a high atomic number, e.g. tungsten or gold are used. Particularly suitable is a gold-palladium alloy, which leads to more uniform conductive layers 2 than pure gold. Furthermore, chromium or aluminum are also possible elements for the conductive layer 2.

According to the invention it is of decisive importance that the conductive layer, the resist and the beam data are adjusted to each other such that due to proximity effects an exposure in the area next to the incident beam is effected to the desired degree.

Figure 1B:
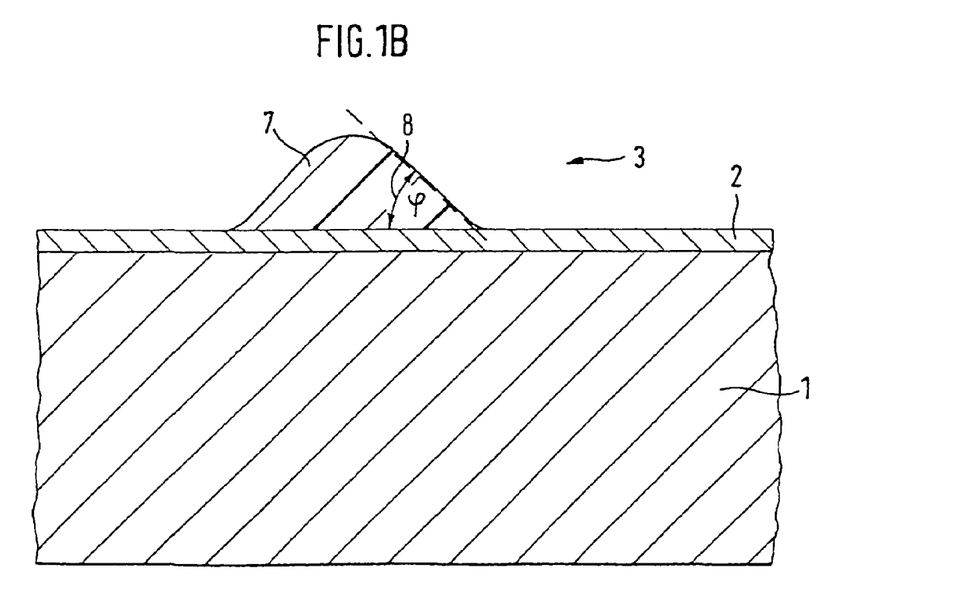

After the development of the negative resist 3 a relief profile 7 is the result, which is represented in a cross-sectional view in FIG. 1B. The relief profile 7 has a flank inclination angle 8, which is clearly smaller than 90°. According to the invention in principle all flank angles can be produced smaller than 90°, angles between about 30° and 89° are preferred.

In case extended diffraction structures are to be formed in the negative resist 3, the procedure is for example as follows:

As a substrate 1 a quartz plate with a thickness of approximately 2 millimeter is used. Onto this quartz plate is vapor-deposited an AuPd layer of a thickness of approximately 80 nanometer serving as conductive layer 2. Onto the conductive layer 2 the negative resist 3 made of an e-beam negative resist material is spin-coated with a thickness of 250 nanometer and baked. The exposure of the negative resist 3 is effected with the help of the electron beam 4, the electrons of which have been accelerated to 5 keV. The electron beam 4 is guided along the lines determined for the diffraction grating and exposes the resist layer 3 in the area of these lines. By the electron beam 4 in a way a diffraction grating is written into the resist layer 3. The diffraction grating in general covers the surface of a grating field, the outline or contour of which is given by the design of the grating image. The distance between the individual paths of the electron beam 4 typically amounts to 1 micrometer.

Figure 2A:
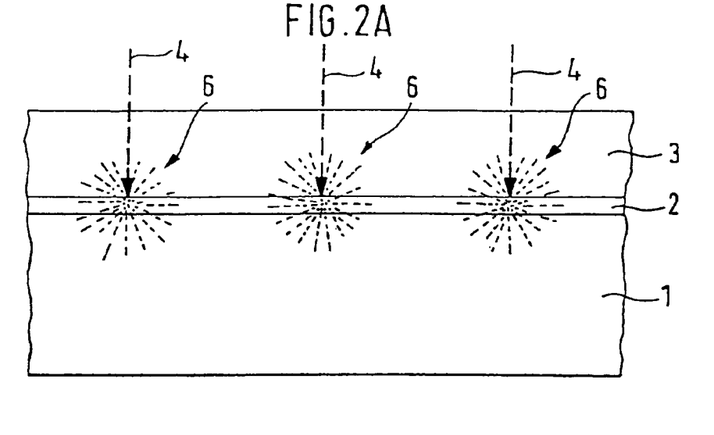
FIG. 2A to C are cross-sectional views through a substrate provided with a negative resist, which is exposed with different radiation dosages by means of an electron beam.
Figure 2B:
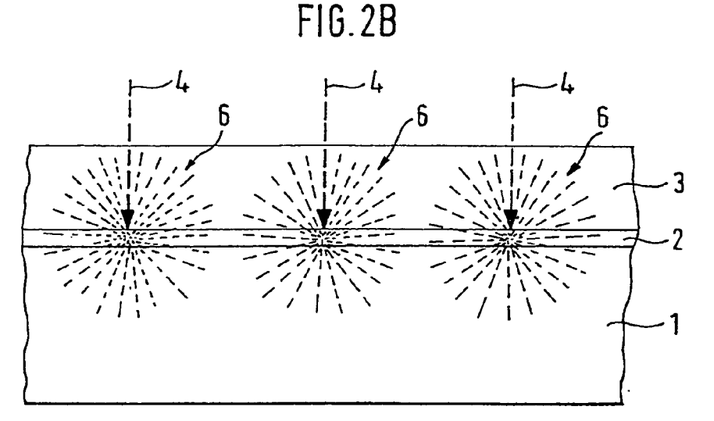
Figure 2C:
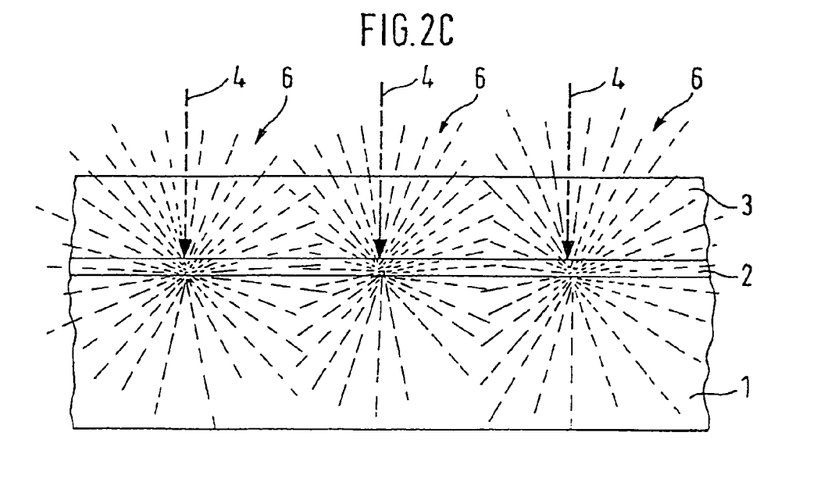

FIGS. 2A to 2C show the extent of the exposure areas 6 in dependence on the radiation dosage. FIG. 2A shows the extent of the exposure area 6 in case of a low radiation dosage, FIG. 2B in case of a medium radiation dosage and FIG. 2C in case of a high radiation dosage. The optimal radiation dosage is determined by tests in dependence on the chosen resist material and proximity layer material.

Figure 3A:
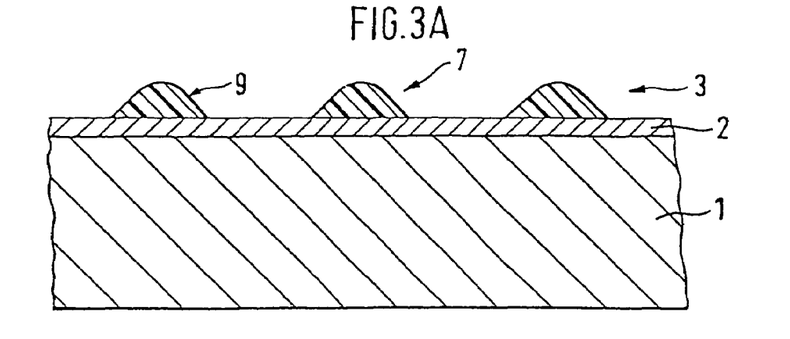
FIG. 3A to C show the substrate of FIGS. 2A to C after the development.
Figure 3B:
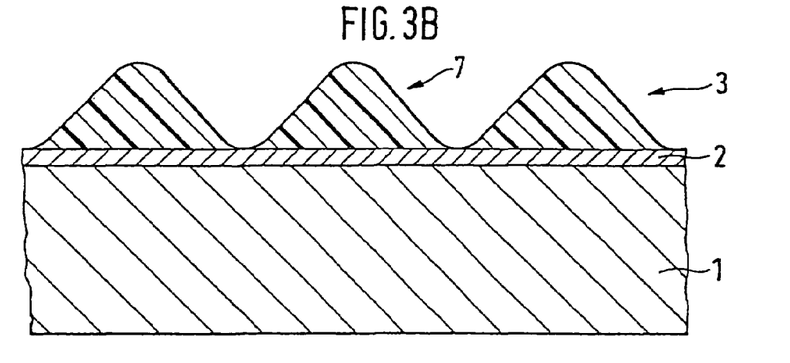
Figure 3C:
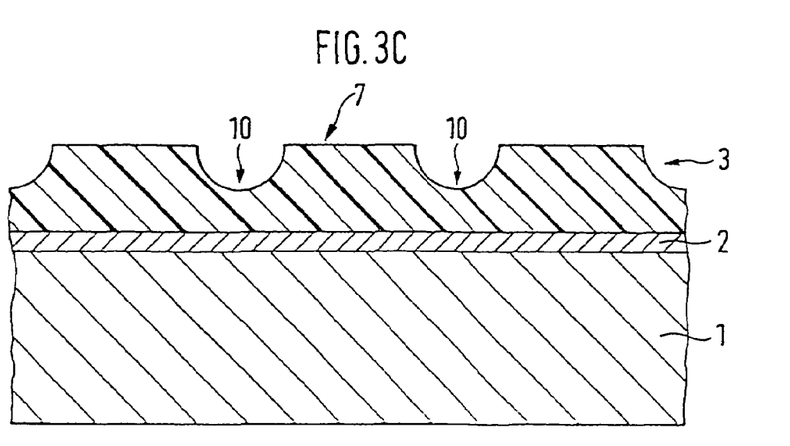

FIGS. 3A to 3C show the relief structures 7, which result from the negative resist 3 of FIGS. 2A to 2C after the development. With a low radiation dosage the relief structure 7 has only isolated rises 9 after the development. The medium radiation dosage shown in FIG. 2B leads to the relief structure 7 with a nearly sinusoidal cross-sectional profile as shown in FIG. 3B. A too high radiation dosage, however, leads to the relief structure 7 as shown in FIG. 3C, in which the developed negative resist layer 3 merely has isolated depressions 10.

Particularly advantageous is the relief structure 7 according to FIG. 3B, since the embossing tools molded from this relief structure show the best separation behavior during the embossing process and since the embossed material as a diffraction grating has a high brilliance in a wide viewing angle area.

The method can also be carried out with a positive resist. Such an embodiment is shown in the FIG. 4A to 4C. With this embodiment as a substrate 1 a quartz glass plate of a thickness of approximately 2 millimeter is used. Onto the substrate 1 a positive resist 11 made of e-beam positive resist material is applied with a 250 nanometer thickness and cured. Onto the positive resist 11 a conductive layer 12 of a thickness of approximately 40 nanometer is vapor-deposited. The exposure is effected with the help of the electron beam 4, the electrons of which have been accelerated to an energy of 5 keV. The writing operation is effected as shown in the embodiments of FIGS. 2A to 2C and FIGS. 3A to 3C. The grating lines typically are written with a distance of approximately 1 micron. By the forward scattering of the primary electrons incident with the electron beam 4 and by the emission of the secondary electrons in the diversion layer 12 the exposure area 6 also comes to lie in the area of the positive resist layer 11. The radiation dosage determined by the electric current and writing speed of the electron beam 4 is optimized by tests.

Figure 4A:
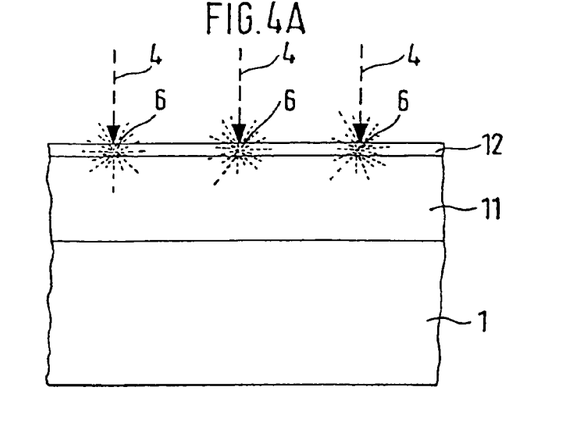
FIG. 4A to C are cross-sectional views through a substrate provided with a positive resist, which is exposed with different dosages with an electron beam.
Figure 4B:
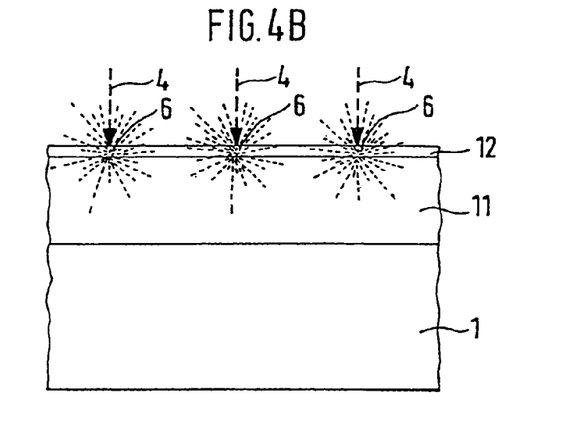
Figure 4C:
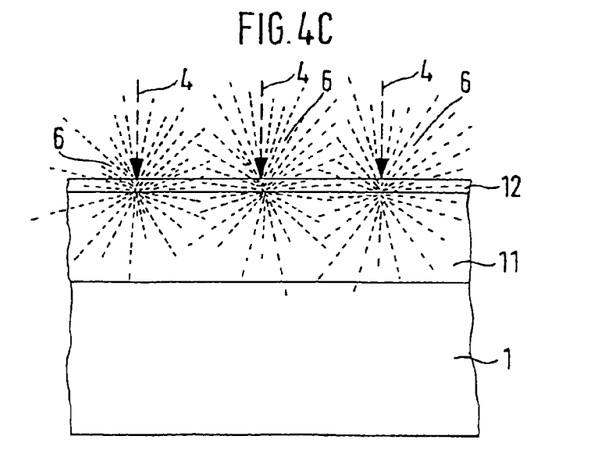

The conductive layer 12 optionally has to be removed after the exposure process. For this purpose suitable solvents are known to the person skilled in the art. For gold for example the gold etching solution of the type TFA of Transene Co., Rowel Mass. is suitable. An etching solution suitable for chromium is an etching solution of the type TR-14 of Cyantek Corp., 3055 Osgood Conn., Fermont Calif. 94548.

Figure 5A:
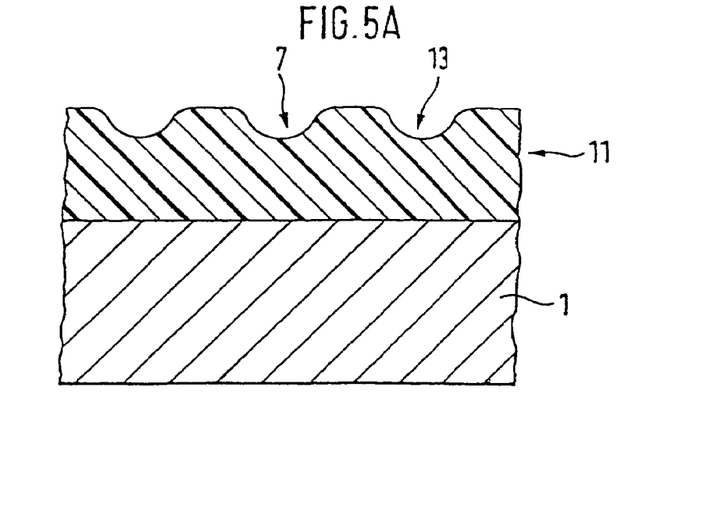
FIG. 5A to C show the substrate of FIGS. 4A and C after the development.
Figure 5B:
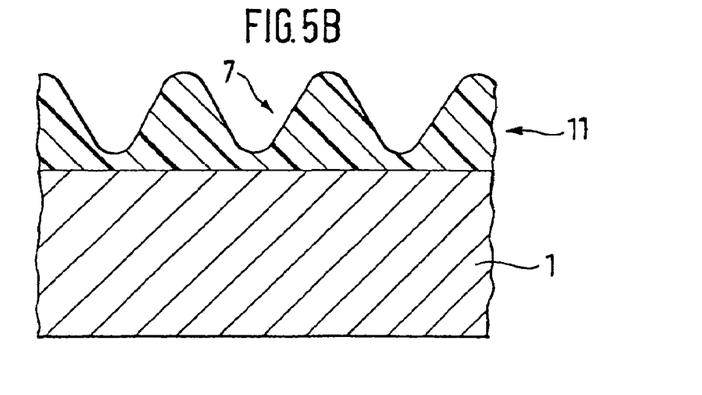
Figure 5C:
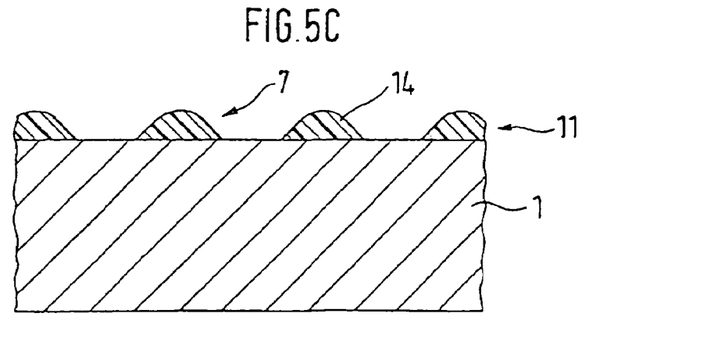

FIG. 5A to 5C show the cross-sectional profile of the positive resist layer 11 after the development. The cross-sectional profile of the positive resist layer shown in FIG. 5A is the result of the low radiation dosage of the electron beam 4 of FIG. 4A. The cross-sectional profiles of the positive resist layer 11 shown in FIGS. 5B and 5C in the same way result from the radiation dosage of the electron beam 4 shown in FIGS. 4B and 4C. With a lower radiation dosage the exposure area extends only slightly beyond the surface of the positive resist layer 11 and into the positive resist layer 11. Accordingly after the development merely isolated depressions 13 are formed in the surface of the positive resist layer 11. But with a medium radiation dosage the positive resist layer 11 after the development shows a nearly sinusoidal profile, which is particularly desirable, since the embossed lacquer can be easily separated from the embossed structures produced by means of the positive resist 11, and the finished variable optical element has a high optical brilliance over a large viewing angle area. In case the radiation dosage is selected too high, the result are the isolated rises 14 as shown in FIG. 5C.

It should be mentioned that after the exposure with the electron beam 4 and before the development of the positive resist 11 the diversion layer 12 has to be dissolved with the help of a suitable etching solution.

Figure 10:
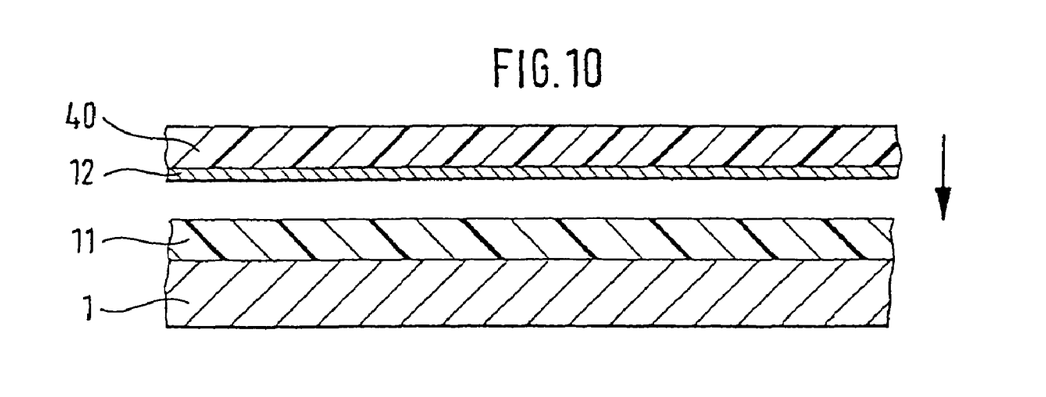
FIG. 10 shows an embodiment, in which the conductive layer is applied onto a separate carrier.

The dissolution of the diversion layer 12 can be avoided, when the diversion layer 12 is disposed on a separate foil 40 as shown in FIG. 10. The foil 40 or the diversion layer 12 are brought into close contact with the resist layer during the exposure process and then can be easily removed by taking off.

Figure 6A:
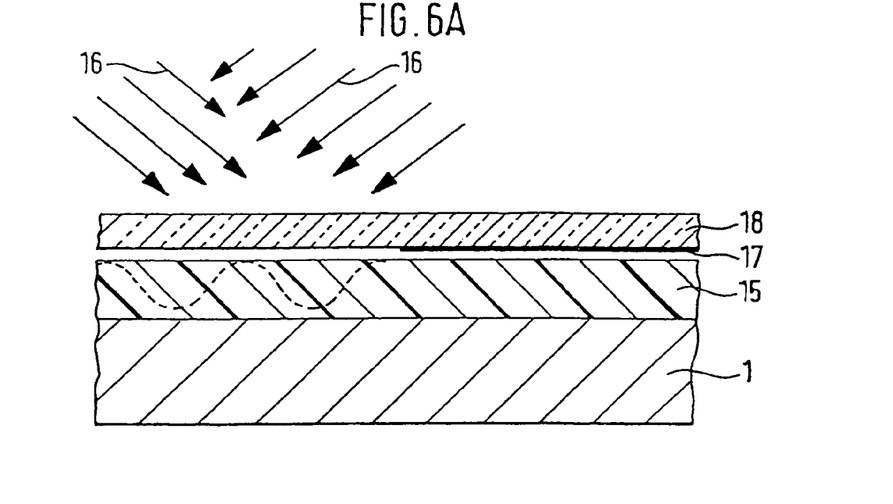
FIG. 6A to C show successive procedure steps of a method comprising a combination of optical exposure and a further exposure by means of an electron beam.
Figure 6B:
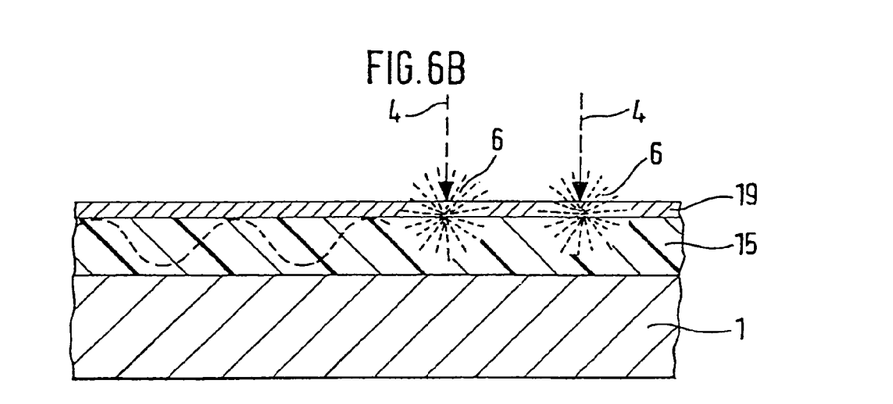
Figure 6C:
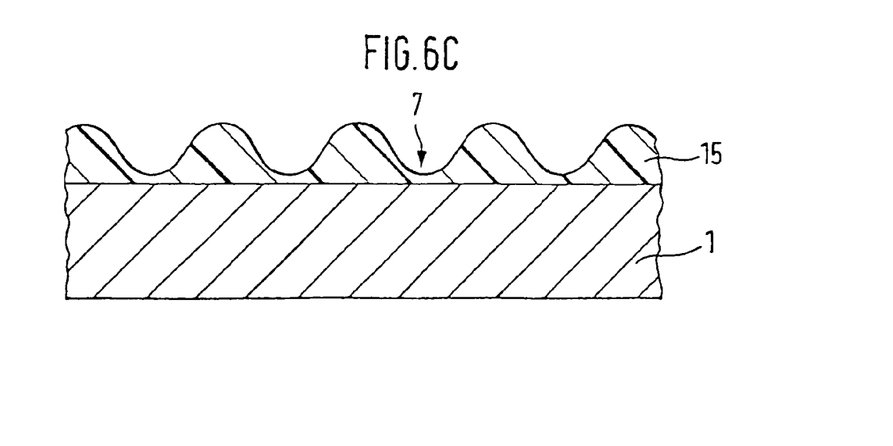

The exposure of a resist layer with the help of the proximity effect described herein can also be used in methods, in which an optical exposure is combined with an exposure by electron beam. FIG. 6A to 6C show successive procedure steps of such a method.

With the method as shown in FIG. 6A to 6C at first a positive resist 15 of a thickness of approximately 250 nanometer is applied, which can be exposed with both blue light and an electron beam. Such a positive resist for example is the resist material of the type AZ 5206 of the Hoechst company.

According to FIG. 6A then a holographic exposure is effected by overlapping spatially expanded, uniformly coherent wave fields 16 in the positive resist 15. During the holographic exposure process the areas of the positive resist 15, which later are to be exposed with the electron beam 4, are covered with the help of an opaque mask 17, which is located on the bottom side of a transparent film 18. The technique of holographic exposure is known to the person skilled in the art.

The holographic exposure produces latent grating structures with a sinusoidal profile in the positive resist 15, which are represented by a dashed line in the FIGS. 6A and 6B. After the holographic exposure onto the not yet developed positive resist 15 is vapor-deposited a diversion layer 19 made of gold preferably having a thickness of 20 to 100 nanometer. The areas of the positive resist 15 that were covered with the mask 17 during the holographic exposure subsequently are exposed with the help of the electron beam 4 according to FIG. 6B. The exposure with the help of the electron beam 4 here can be effected such that the grating fields of a grating image limited with a contour or an outline are filled with different diffraction gratings. Due to the scattering of the primary electrons and the emission of the secondary electrons in the conductive layer 19 the exposure areas 6 extend into the positive resist layer 19 to such a degree that after the development the grating lines written with the help of the electron beam 4 also have the sinusoidal profile as shown in FIG. 6C. Before the development of the positive resist layer 15, however, the diversion layer 19 has to be removed with the help of an etching solution.

Figure 7A:
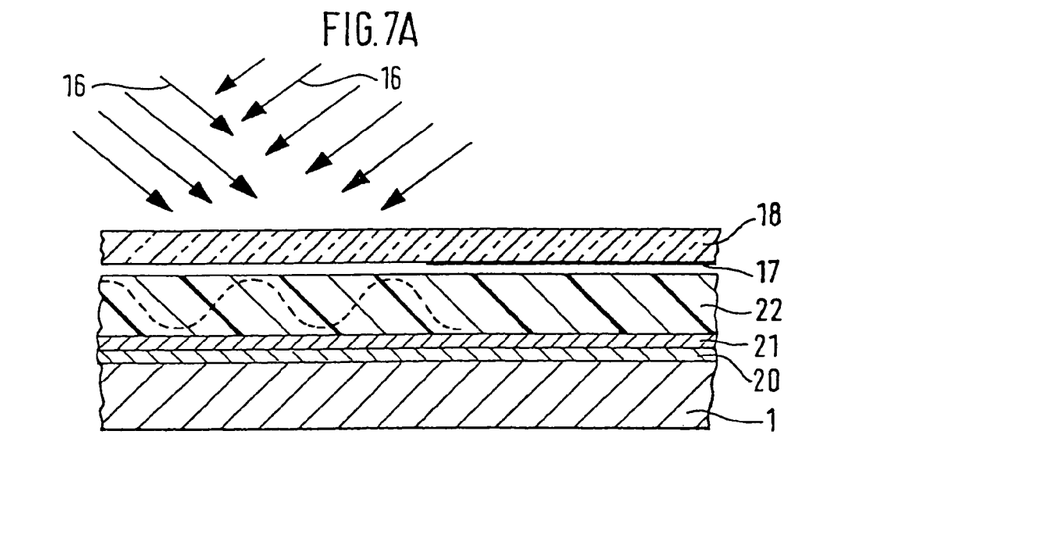
FIG. 7A to 7C show successive procedure steps of a further method comprising a combination of optical exposure and a further exposure by means of an electron beam.

For a method that combines an optical exposure with an electron beam exposure a negative resist can be selected likewise. In the FIG. 7A to 7C are shown procedure steps of such a method.

In this method onto the substrate 1 a diversion layer 20 is applied, which is covered with an antireflection layer 21. Onto the antireflection layer 21 a negative resist 22 is applied, which can be exposed with both blue light and with an electron beam. During the holographic exposure by means of spatially extended, uniformly coherent wave fields 16 the area of the negative resist layer 22 intended for the exposure with the electron beam 4 is covered with the help of the mask 17. This procedure step is shown in FIG. 7A. During the holographic exposure the antireflection layer 21 serves for preventing reflections on the metallic diversion layer 20, which may disturb the overlapping of the wave fields 16 in the area of the negative resist 22. The result of the holographic exposure is the latent diffraction grating which is represented as a dashed line in FIGS. 7A and 7B.

Figure 7B:
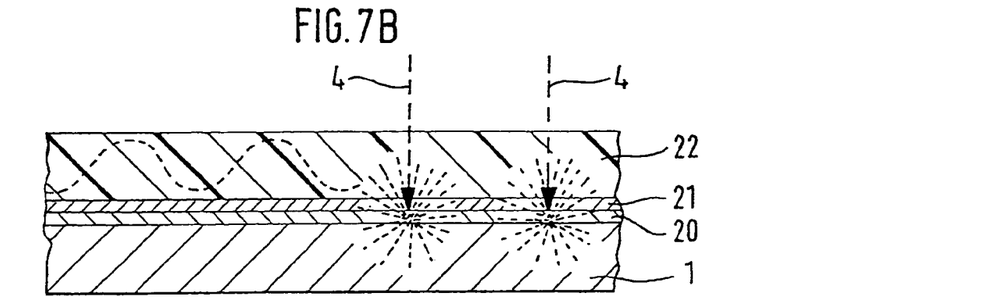
Figure 7C:
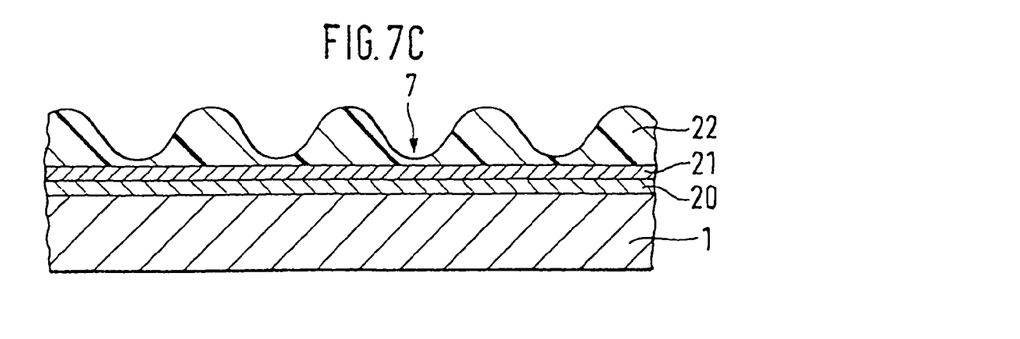

Before the development of the negative resist 22 the substrate is exposed with the electron beam 4 as shown in FIG. 7B, the backscattered primary electrons and the emission of the secondary electrons ensuring that the exposure area 6 extends into the negative resist 22. When the exposure parameters of the electron beam 4 are selected in a suitable way the result are the grating lines with a sinusoidal grating profile as shown in FIG. 7C in cross section.

The combined methods as shown in the FIGS. 6 and 7 in particular are used when an image is to be produced that has a motif disposed in front of a background. The background can be produced with the holographic exposure, while the grating fields of the motif are produced with the help of the electron beam 4.

The electron beam recording method according to the invention of course can be combined with any other exposure method and recording method. This applies to all described embodiments.

The embodiment of a combined method as shown in the FIG. 6A to 6C offers the advantage that the positive resist in general has a higher sensitivity than a negative resist. For that reason in the embodiment shown in the FIG. 6A to 6C the conductive layer has to be removed before the development. This procedure step can be omitted in the embodiment of a combined method with a negative resist as shown in FIG. 7A to 7C.

It should be mentioned that the negative resist 22 or the positive resist 15 do not have to be made of a uniform resist material. It is also thinkable to provide different resist materials in certain areas of the positive resist 15 and the negative resist 22, which can also have different thicknesses.

Figure 8A:
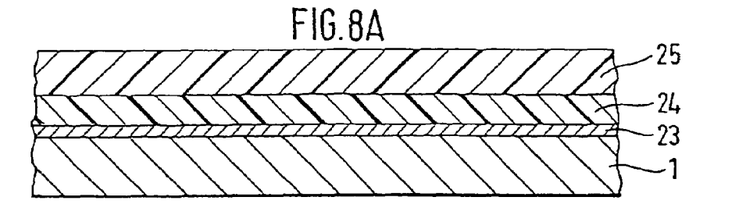
FIG. 8A to E show successive procedure steps of a method, wherein onto a substrate two resist layers are applied that are intended for the optical exposure and the exposure with an electron beam respectively.

Furthermore, it is also possible to dispose resist layers of different kinds one above the other. FIG. 8A to 8E show an embodiment of a method, wherein at first a conductive layer 23 is applied onto the substrate 1. Above the conductive layer 23 is located a negative resist 24, which to a far extent is insensitive to optical radiation. In addition the negative resist 24 is darkly colored, so that optical radiation is absorbed in the negative resist 24. But the negative resist 24 is suitable for exposure with the electron beam 4. The negative resist 24 has a layer thickness of for example 200 nanometer which is suitable for the electron beam exposure. Above the negative resist 24 a positive resist 25 of a thickness of 400 nanometer is applied, which has a high sensitivity to optical radiation. With that the substrate shown in FIG. 8A is ready for the exposure.

Figure 8B:
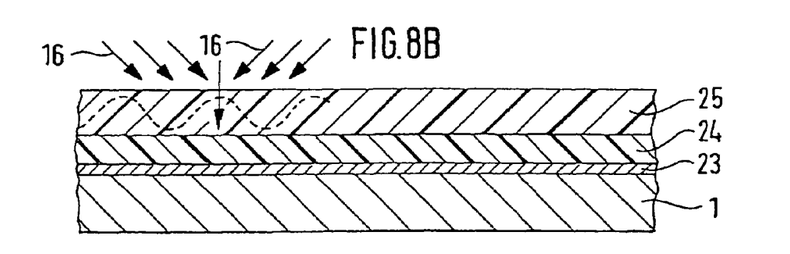
Figure 8C:
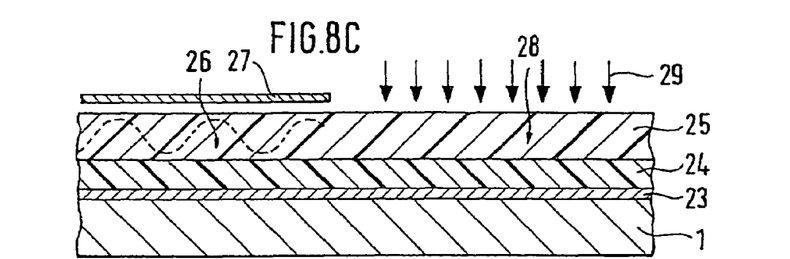

The following exposure steps can be carried out in any order. The shown embodiment starts with the optical exposure. An area intended for the optical exposure is impinged with electromagnetic radiation 16 in a holographic manner, e.g. with a laser. The area 26 exposed in such a fashion contains the latent diffraction grating, which is indicated in FIG. 8B by a dashed sinusoid. The negative resist 24 lying in the area 26 due to its optical insensitiveness is not damaged and serves as an absorbing layer, so as to avoid undesired light reflections. The area 26 optically exposed in this way is now covered with a mask 27 and an area 28 intended for the electron beam exposure at first is pre-exposed with blue light 29 all-over, so as to make soluble the positive resist 25 in the area 28. The action of the blue light 29 due to the insensitiveness to light of the negative resist 24 has no effect on the negative resist 24 located in the area 28.

Figure 8D:
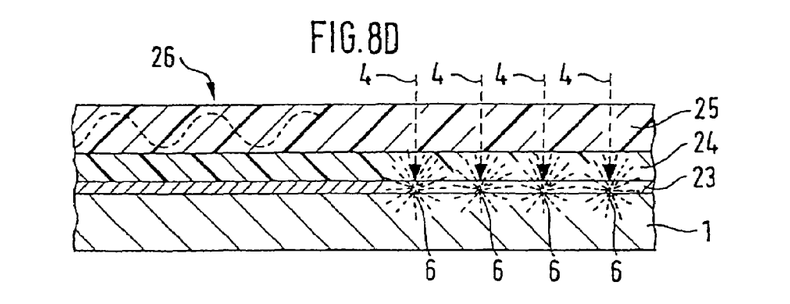

After the exposure with the blue light 29 the exposure with the electron beam 4 according to FIG. 8D is effected. Due to the backscattered primary electrons and the emission of the secondary electrons the negative resist 24 is exposed as to form the desired diffraction gratings. The damage the electron beam 4 causes in the positive resist 25 are irrelevant, since in the end the positive resist 25 in the area 28 is removed. With that the exposure process is completed.

Figure 8E:
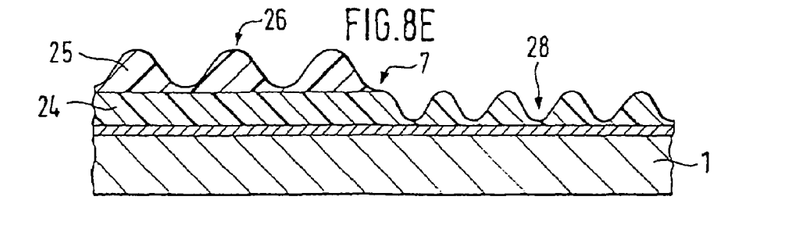

During the development out of the latent images peak-and-valley profiles are formed, which are shown in FIG. 8E in cross section. In the area 26 now a holographic image is present and in the area 28 the negative resist 24 forms a diffraction grating with a sinusoidal cross-sectional profile.

Figure 9:
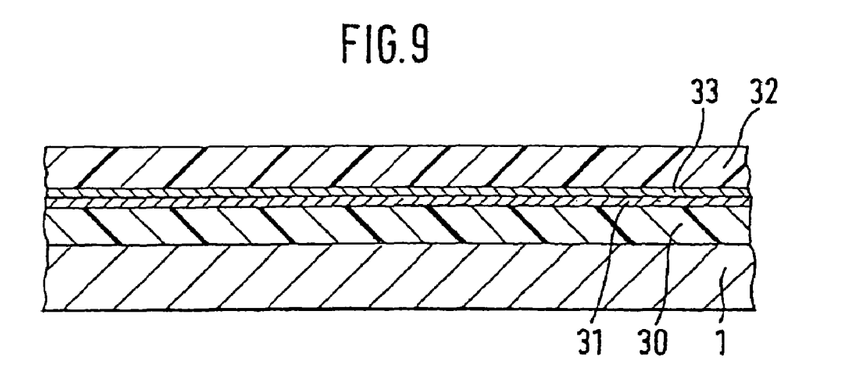
FIG. 9 shows a modified embodiment of a resist substrate.

FIG. 9 shows a modified layer structure, which, however, is treated in the same way as the layer structure shown in FIG. 8A. In the modified layer structure onto the substrate 1 a positive resist 30 is applied, which is covered with a conductive layer 31. Thereabove is located a positive or negative resist 32, which is sensitive to optical light. Intermediate between the resist layer 32 and the conductive layer 31 an antireflection layer 33 is disposed. With this structure, too, a relief structure as shown in FIG. 8E can be produced by exposing the resist layer 32 with the help of electromagnetic radiation and the resist layer 30 with the help of the electron beam 4.

The relief structures 7 produced by exposure and development can be processed as resist masters as usual in optical holography. Therefore, subsequently a thin silver layer is applied by vapor deposition or chemical deposit, and a nickel mold is made in the ceramic bath The nickel mold can be duplicated and used as an embossing die for embossing an embossed layer. In the end the embossing layer is transferred onto the definite substrate, for example a bank note, credit card or a packaging material, with or without a metallically shining reflection background layer.

Finally, it should be noted that the drawings are not true-to-scale. Instead the drawings are only suitable for illustrating the principle of the embodiments described here.

The invention claimed is:

1. Method for producing a substrate including a resist layer in the form of a relief structure, which represents a diffraction structure, and including a conductive layer at least in certain areas adjoining the resist layer, wherein during the exposure of the resist layer by means of an electron beam the conductive layer scatters the primary electrons and/or produces secondary electrons, comprising the steps:

the material of the resist layer and the conductive layer and the exposure parameters are adjusted relative to each other such that the resist layer is also exposed outside the area impinged with the electron beam so that the flanks of the relief structure obtain an inclined form, wherein when the resist layer is manufactured of a negative resist, the conductive layer is disposed intermediate between the resist layer and the substrate; and when the resist layer is manufactured of a positive resist, the conductive layer is disposed before the resist layer when viewed in the direction of beam impingement.

2. Method according to claim 1, wherein the relief structure is produced with a flank inclination angle smaller than 89°.

3. Method according to claim 1, wherein the conductive layer contains at least one of the elements tungsten, gold, palladium, chromium, aluminum or alloys of these elements.

4. Method according to claim 1, wherein intermediate between the conductive layer and the resist layer there is disposed an optical antireflection layer.

5. Method according to claim 1, wherein onto the resist layer a further resist layer is applied which is sensitive to electromagnetic radiation.

6. Method according to claim 1, wherein above the resist layer a further resist layer is disposed.

7. Method according to claim 1, wherein the substrate is the conductive layer.

8. Method according to claim 1, wherein the conductive layer is disposed on a separate foil.

9. Method according to claim 1, wherein for the resist layer a resist material is used, which is sensitive to the exposure with electromagnetic radiation and the exposure with the electron beam, and that a part of the resist layer, under usage of a mask, is impinged with electromagnetic radiation.

10. Method according to claim 5, wherein a part of the further resist layer is exposed with electromagnetic radiation and the resist layer located behind the further resist layer when viewed in the beam impingement direction is exposed to the electron beam.

11. Method according to claim 9, wherein in the part of the resist layer exposed with electromagnetic radiation or the further resist layer a true hologram is produced.

12. Method according to claim 9, wherein by the exposure with electromagnetic radiation of the resist layer or the further resist layer a diffraction grating is produced.

13. Method according to claim 1, wherein by the exposure with the electron beam a diffraction grating is produced in the resist layer.

14. Method according to claim 1 wherein the conductive layer is produced out of a material which contains at least one metallic element having an atomic number higher than 50.

* * * * *

UNITED STATES PATENT AND TRADEMARK OFFICE
CERTIFICATE OF CORRECTION

| | | |
|---|---|---|
| PATENT NO. | : 7,655,381 B2 | Page 1 of 1 |
| APPLICATION NO. | : 10/545261 | |
| DATED | : February 2, 2010 | |
| INVENTOR(S) | : Wittich Kaule | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 947 days.

Signed and Sealed this

Twenty-eighth Day of December, 2010

David J. Kappos
*Director of the United States Patent and Trademark Office*